United States Patent [19]
Suzuki

[11] Patent Number: 6,084,901
[45] Date of Patent: Jul. 4, 2000

[54] SEMICONDUCTOR LASER DEVICE

[75] Inventor: Naofumi Suzuki, Tokyo, Japan

[73] Assignee: NEC Corporation, Japan

[21] Appl. No.: 08/992,768

[22] Filed: Dec. 17, 1997

[30] Foreign Application Priority Data

Dec. 17, 1996 [JP] Japan .................................. 8-336695

[51] Int. Cl.[7] .................................................. H01S 3/085
[52] U.S. Cl. .............................. 372/96; 372/45; 372/46
[58] Field of Search .................................. 372/96, 45, 46

[56] References Cited

U.S. PATENT DOCUMENTS

| | | | |
|---|---|---|---|
| 5,668,900 | 9/1997 | Little et al. | 372/96 |
| 5,727,013 | 3/1998 | Botez et al. | 372/96 |

FOREIGN PATENT DOCUMENTS

| | | | |
|---|---|---|---|
| 4100291 | 4/1992 | Japan | H01S 3/18 |
| 4309280 | 10/1992 | Japan . | |
| 6275917 | 9/1994 | Japan | H01S 3/18 |
| 7202333 | 8/1995 | Japan . | |

OTHER PUBLICATIONS

Sakata et al; "All Selective MOVPE Grown BG–LD's Fabricated by the Novel Self–Alignment Process"; Feb. 1996; pp. 179–181; IEEE Photonics Technology Letters, vol. 8, No. 2.

*Primary Examiner*—James W. Davie
*Attorney, Agent, or Firm*—Hayes, Soloway, Hennessey, Grossman & Hage, P.C.

[57] ABSTRACT

A semiconductor laser device comprises a mesa structure selectively grown on a InP substrate, the mesa structure having a laser active layer and an optical guide layer, current blocking layer disposed on both sides of the mesa structure and an embedding layer formed on the optical guide layer. Each of the current blocking layer and embedding layer has a refractive index lower than the refractive index of the optical guide layer. The selective growth of the mesa structure changes the thickness and width of the optical guide layer in the opposite directions to cancel the change in the lasing wavelength caused by fabrication errors.

5 Claims, 7 Drawing Sheets

SEMICONDUCTOR LASER DEVICE

FIELD OF THE INVENTION

The present invention relates to a semiconductor laser device having a diffraction grating for effecting a distributed feedback for laser light emitted from an active laser. The present invention also relates to a method for manufacturing such a semiconductor laser device.

DESCRIPTION OF THE RELATED ART

A semiconductor laser device of distributed feedback type is well known in the art in which a diffraction grating is provided in the vicinity of an active layer of the semiconductor laser and a lasing operation is effected by a distributed feedback of light through the diffraction grating. In the semiconductor laser device of the type described, the lasing wavelength can be controlled in accordance with the pitch of the diffraction grating, and hence the laser device finds its application as a light source such as for a long distance high capacity optical communication system which utilizes a single mode optical fiber or a wavelength division multiplex as well as for other electronic equipment.

It is important to realize highly uniform production of semiconductor lasers having a precisely controlled wavelength in a high reproducibility on a wafer. The semiconductor laser of distributed feedback type has a lasing wavelength $\lambda$, which is expressed as "$\lambda=2n_{eff}\Lambda$" where $\Lambda$ represents the pitch of a diffraction grating and $n_{eff}$ an effective refractive index for a combination of an active layer and an optical guide layer.

Accordingly, it is necessary that the pitch of the diffraction grating and the effective refractive index of the combination be evenly controlled in order to achieve an even lasing wavelength. The recent advances in the direct electron beam lithography have enabled the formation of a highly even diffraction grating. The effective refractive index of the combination of active layer and optical guide layer is principally determined by the compositions, thicknesses and widths of the active layer and the optical guide layer in the semiconductor laser device. The requirement for the composition and thickness has been achieved to some extent as evidenced by the fact that an InGaAsP layer grown by a MOVPE (metal-organic vapor deposition epitaxy) process achieves a deviation as low as within 2 nm in the lasing wavelength and deviation within ±1% in a film thickness for a two-inch substrate (see S. Ae, et al. J. Cryst. Growth, 145, p852, 1994). By contrast, the film width is determined by a width of a mesa structure for the active layer during the embedding process or burying process in the manufacture of the semiconductor laser device, and varies from element to element because the mesa structure for the active layer is currently formed by wet etching. Thus, a variation in the lasing wavelength which occurs from element to element principally depends on the variation in the mesa width. To suppress the variation in the mesa width, it is contemplated to form the mesa structure by a dry etching technique. However, in this process, a defect in the interface formed by the re-growth process arises due to damages resulting from the prior etching process, to degrade the response characteristics of the laser device, which obstacles its practical use.

In view of the foregoing, it is an object of the present invention to provide a semiconductor laser device of distributed feedback type which is capable of providing an excellent wavelength evenness by suppressing a variation in the lasing wavelength from element to element caused by a variation in the width of an active layer and an optical guide layer.

It is another object of the present invention to provide a method of manufacturing the semiconductor laser device as described above.

The present invention provides a semiconductor laser device comprising a semiconductor substrate, a mesa structure having a shape substantially of a trapezoid in cross-section and selectively grown on the semiconductor substrate, the mesa structure having an active layer for emitting laser light and an optical guide layer overlying the active layer and having a diffraction grating thereon, the diffraction grating implementing distributed feedback for the laser light.

The present invention also provides a method for manufacturing a semiconductor laser device comprising the steps of forming a mask layer having an opening on a substrate, selectively crystal growing, on a portion of the substrate exposed from the opening, a mesa structure having a laser active layer and an optical guide layer overlying the active layer, and forming a diffraction grating on a top surface of the optical guide layer.

In the semiconductor laser device according to the present invention, the selective growth of the active layer and the optical guide layer achieves an even lasing wavelength of the laser device due to the compensation between the changes in the effective refractive index of the optical guide layer caused by the variation in the film thickness of the optical guide layer and caused by the variation in the width of the optical guide layer.

The above and other objects, features and advantages of the present invention will be more apparent from the following description, referring to the accompanying drawings.

DESCRIPTION OF THE PREFERRED EMBODIMENTS

Before describing the preferred embodiments of the present invention, the principle of the present invention will be described, for the sake of understanding of the present invention, with reference to some of the accompanying drawings, wherein similar constituent elements are designated by the same or similar reference numerals throughout the drawings.

Figure 1A:
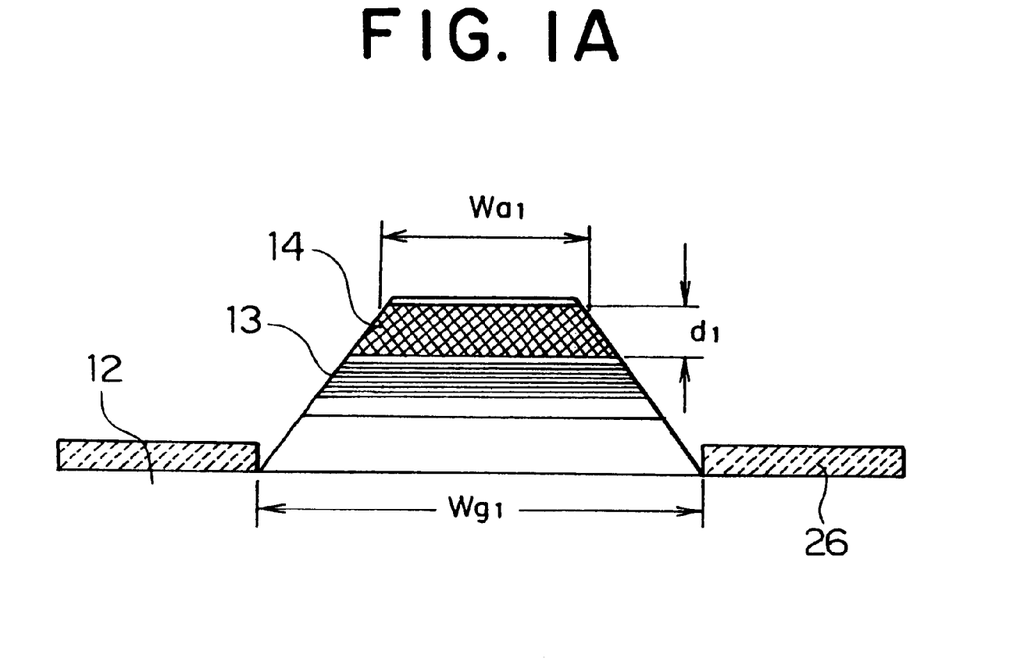
FIGS. 1A and 1B are cross-sectional views of semiconductor laser devices for showing the difference in the layer thickness accompanied by a difference in the layer widths of semiconductor laser devices in the present invention.
Figure 1B:
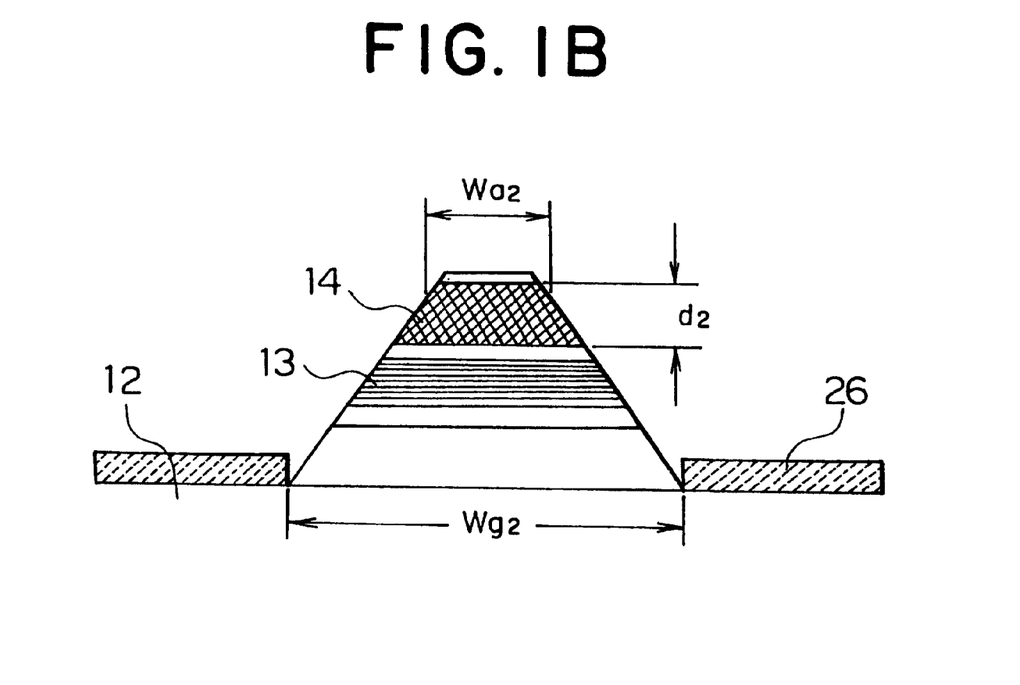
Figure 2A:
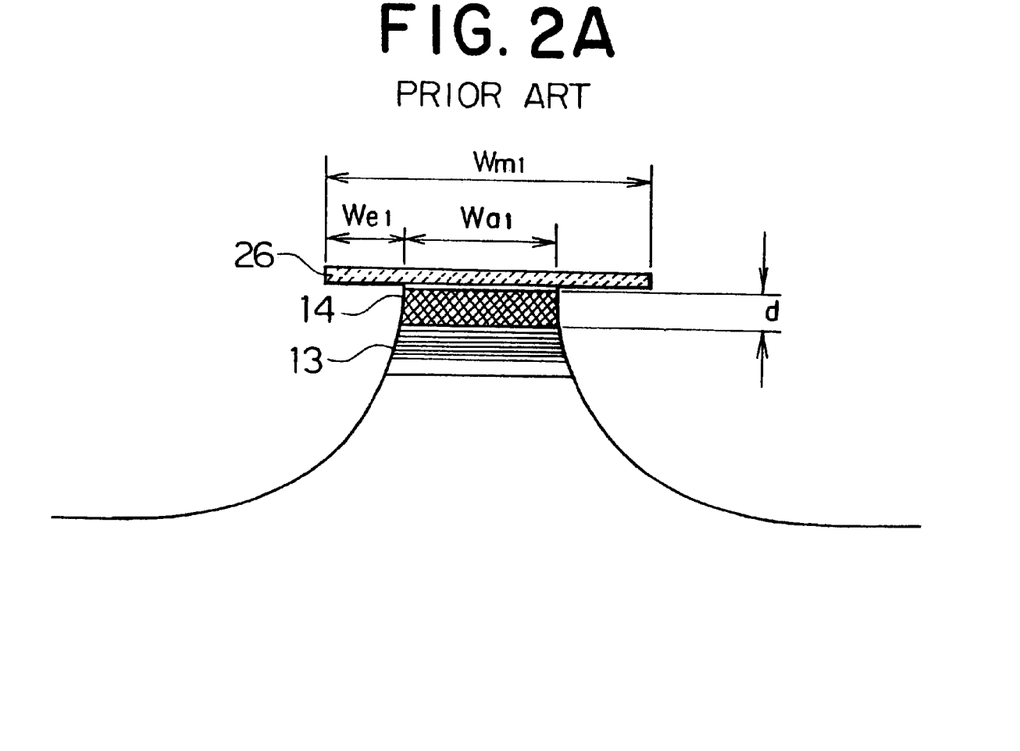
FIGS. 2A and 2B are cross-sectional views of conventional semiconductor laser devices for showing the difference in the layer thickness similarly to FIGS. 1A and 1B.
Figure 2B:
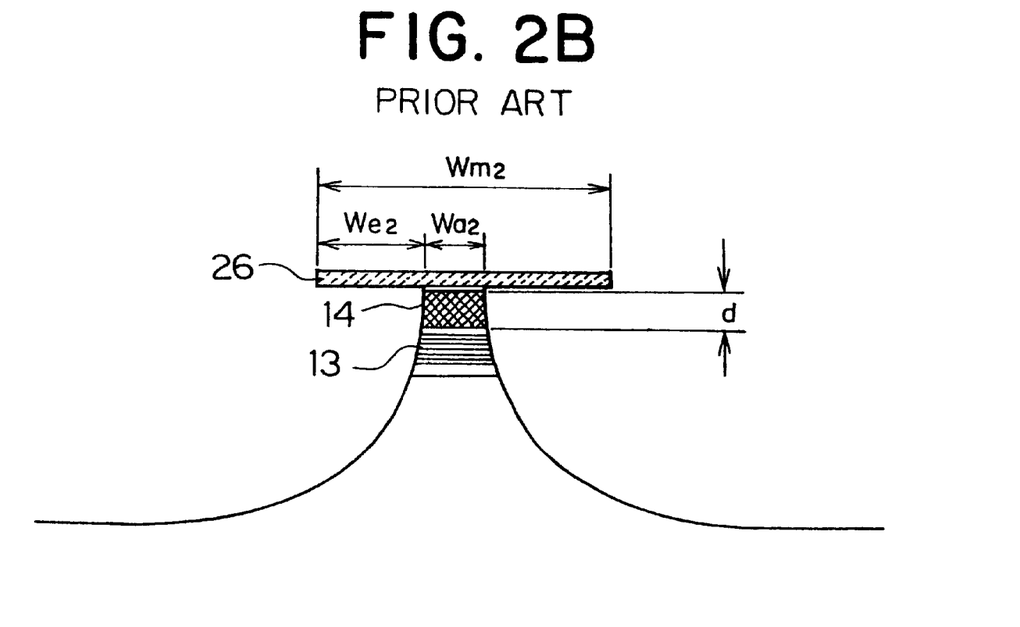

Referring first to FIGS. 1A and 1B, there is shown the difference in the film thickness which is accompanied by the difference in the layer width in the present invention. If an optical guide layer 14 has a refraction index greater than the refraction index of an embedding layer (not shown) in a semiconductor laser device, in general, a greater width or a greater film thickness of the optical guide layer 14 provides a greater effective refractive index of the semiconductor laser. In the prior art, as shown in FIGS. 2A and 2B, the active layer 13 and the optical guide layer 14 are consecutively grown on a flat surface and a mesa structure for the active layer 13 and the optical guide layer 14 is then formed by a wet etching technique, which provides a constant layer thickness. As a consequence, a variation in the width of the active layer 13 and the optical guide layer 14, which is attributable to a change in the lateral width of a mask used in the etching or a change in the etching rate, is directly reflected on a change in the effective refractive index, or a change in the lasing wavelength.

By contrast, in the method for manufacturing a mesa structure by a selective growth process according to the present invention, the width of the optical guide layer, or the mesa width in the region of the optical guide layer, depends on the width of an opening in the mask, or the width of a selective growth region. Accordingly, if the latter width is small, the former width is also small or vice versa. In other words, as illustrated in FIGS. 1A and 1B, when the widths Wg1 and Wg2 of the regions for the selective growth in the semiconductor laser satisfy the relationship Wg1>Wg2, the widths Wa1 and Wa2 of the optical guide layers also satisfy the relationship Wa1>Wa2.

The selective growth process generally provides a mesa structure having a (111)B facet in each of the side surfaces of the mesa structure. Accordingly, the growth rate increases as the growth process proceeds, and the rate of the increase in the growth rate increases in inverse proportion to the width of the opening in the mask, or the width of the region of the selective growth. As a result, if the width of the region for the selective growth is small, the optical guide layer will be thicker. Thus, the relationship between the layer thicknesses d1 and d2 is such that d1<d2, as illustrated in FIGS. 1A and 1B. In this manner, if the width of the opening in the mask varies depending on the process parameters to result in Wg1>Wg2, there results the relationship d1<d2. Hence, the variation in the effective refractive index caused by a difference in the width of the optical guide layer and a variation in the effective refractive index caused by a difference in the thickness of the optical guide layer compensate each other in the present invention, thereby suppressing a variation in the lasing wavelength attributable to a variation in the opening in the mask.

Besides, the method of the present invention has an advantage as follows. In the method of prior art for forming a mesa structure by wet etching, the width of the optical guide layer is determined by the lateral width of the mask and the amount of side etching, as shown in FIGS. 2A and 2B, and hence a variation in the width of the optical guide layer is caused by two factors: the mask width and the etching rate. By contrast, according to the selective growth process as used in the present invention, the width of the optical guide layer is determined by the width of the opening in the mask, which depends solely on the accuracy of the lithography. Accordingly, in the semiconductor laser device and the method according to the present invention, the variation in the width of the optical guide layer can be reduced in comparison to the prior art. Since the semiconductor is not subjected to etching in the present invention, a defect in the re-growth interface does not occur.

Figure 3:
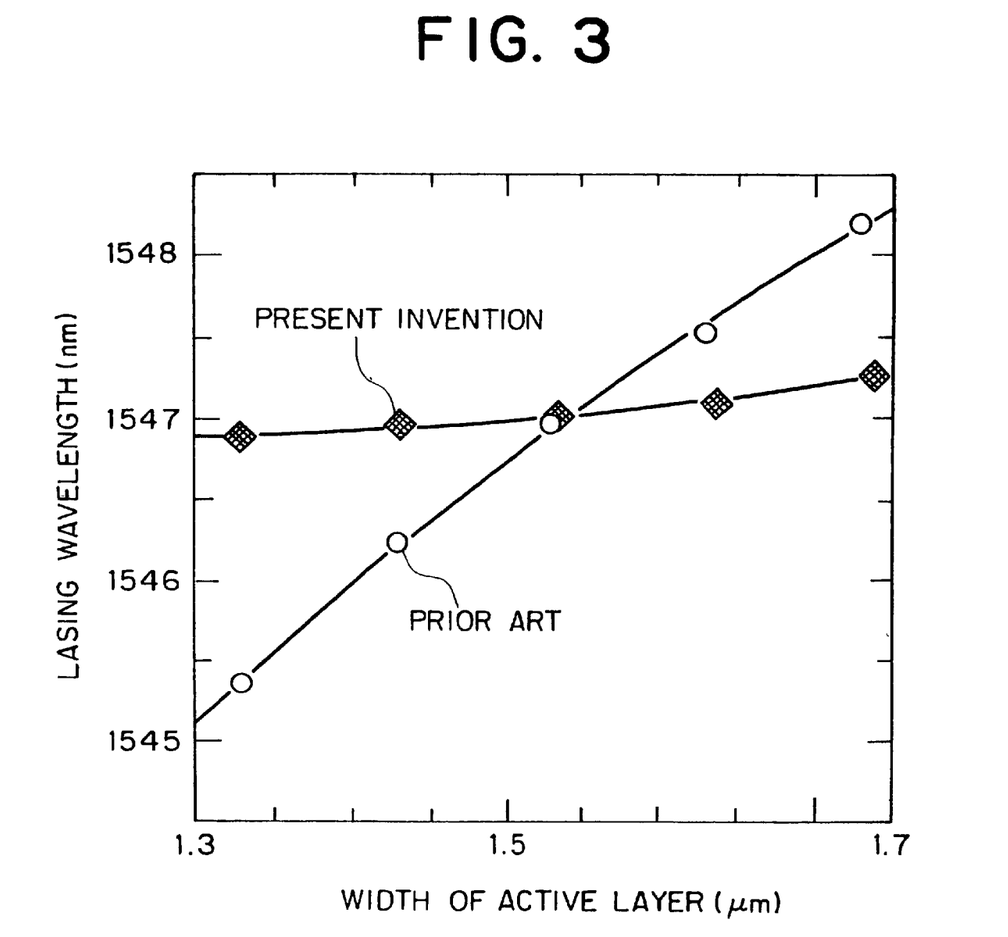
FIG. 3 is a graph showing the lasing wavelength plotted against the width of the active layer.

FIG. 3 graphically illustrates an exemplary calculation for comparing the dependency of the lasing wavelength on the width of the active layer, as determined in terms of the effective refractive index, between the mesa structures formed by using the selective growth technique according to the present invention and by using the wet etching of the prior art for InGaAsP semiconductor lasers. The layer structure is that shown in the first embodiment to be described later. In the prior art, a variation of ±0.2 $\mu$m in the width Wa of the active layer produces a variation in the lasing frequency up to ±1.4 nm. By contrast, according to the method of the present invention, a corresponding variation is drastically reduced to about ±0.2 nm.

As described above, it is possible to manufacture a semiconductor laser of distributed feedback type by the present invention, which exhibits an excellent evenness of the lasing wavelength and excellent response characteristics.

In order for obtaining the described advantages, variations in the effective refraction index as caused by variations in the width and thickness of the optical guide layer should compensate each other. This is achieved by the configuration in that refractive indices of the current blocking layers, disposed on both sides of the optical guide layer, and the overlying embedding layer are both greater or both less than the refractive index of the optical guide layer. However, it is generally known that a greater refractive index of the semiconductor layer provides a less bandgap therein. Hence, the greater refractive index causes that a potential barrier will be formed between the embedding layer and the optical guide layer, thereby degrading the current injection efficiency. Further, in this case, the bandgap of the current blocking layer decreases to thereby increase the leakage current.

Thus, it is preferable that the refractive indices of both the current blocking layers and the overlying embedding layer be less than the refractive index of the optical guide layer. As an example of a material for the semiconductor laser which satisfies this requirement, an InGaAsP based semiconductor grown on an InP substrate may be recited.

For a semiconductor laser having an AlGaAs or AlGaInP based semiconductor material grown on a GaAs substrate, it is necessary to use a material having an Al enriched composition for the embedding layer and the current blocking layer in order to satisfy the above condition. However, in this instance, an oxidation of Al located in the vicinity of the exposed surface occurs during the re-growth step subsequent to the formation of the diffraction grating to thereby prevent an excellent re-growth interface from being obtained. This degrades the lasing response and causes a variation in the response from product to product. Since the refractive index of a semiconductor changes depending on the current density therein, the variation in the operating current of the laser device induces a variation in the refractive indices of the active layer and the optical guide layer from laser to laser, with the consequence of a greater variation in the lasing wavelength. By contrast, with an InGaAsP based semiconductor laser, such problems do not occur, and hence InGaAsP based material is most preferred for use with the teaching by the present invention.

Figure 4A:
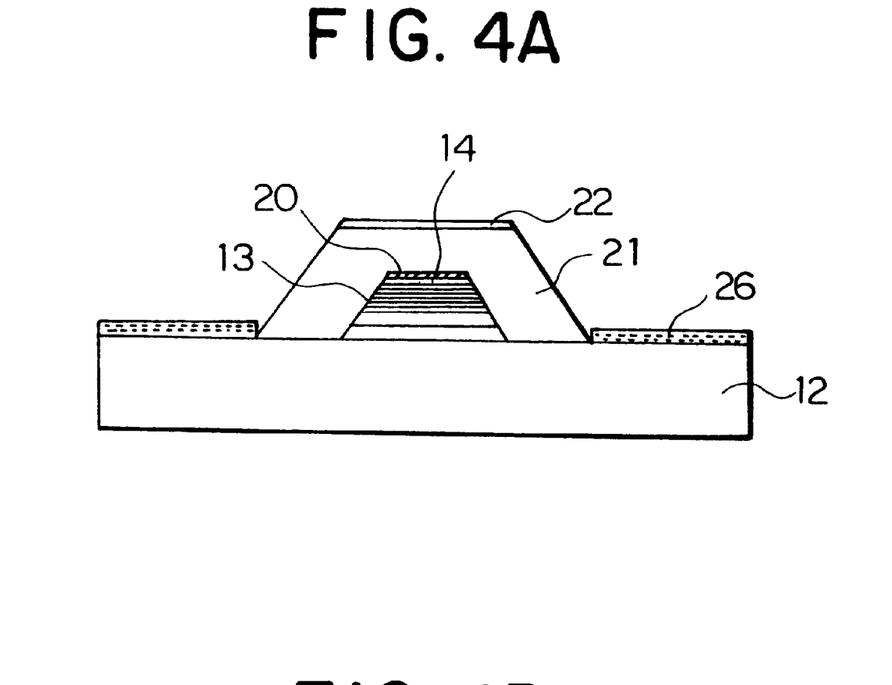
FIGS. 4A and 4B are cross-sectional views of the semiconductor laser device during consecutive steps in a method for fabrication thereof according to a first embodiment of the present invention.
Figure 4B:
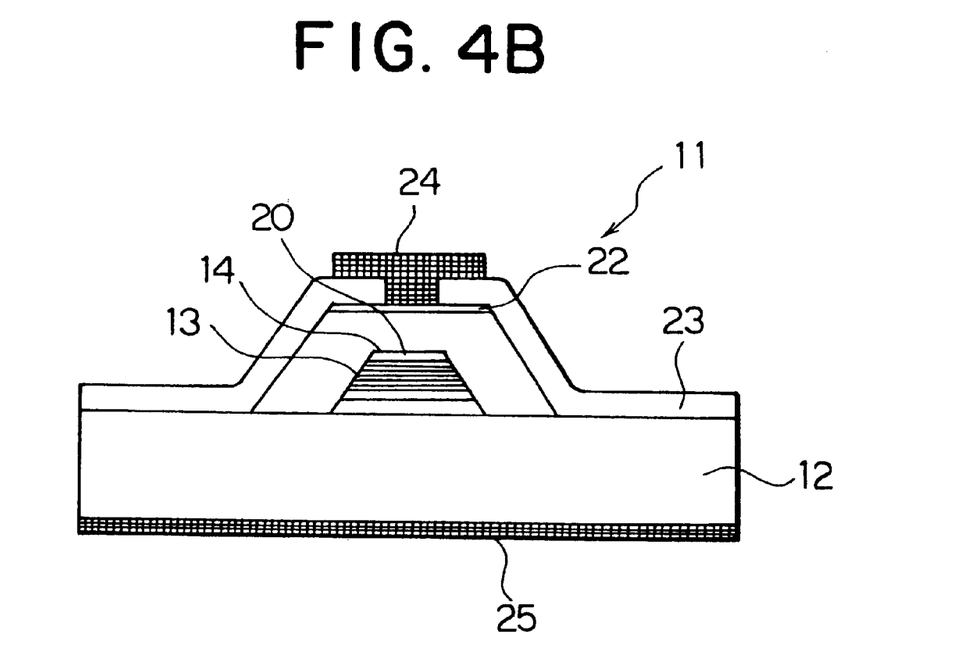

Now, the preferred embodiments of the present invention will be described with reference to the accompanying drawings. Referring to FIGS. 4A and 4B, there are shown consecutive steps of manufacturing a semiconductor laser device according to a first embodiment of the present invention. First, a $SiO_2$ film is formed to a thickness of about 100 nm by a thermal CVD process on an n-InP substrate 12 having a surface orientation (100), followed by forming an opening parallel to <011> direction in the $SiO_2$ film 26 by using photolithography to define a pair of masks 26. By way of example, the mask 26 has a lateral width of 5 μm and the opening has a lateral width of 2 μm. Then, an active layer 13 and an optical guide layer 14 are consecutively formed on the surface of the substrate 12 by a selective growth process through the opening defined between the masks 26.

Figure 5:
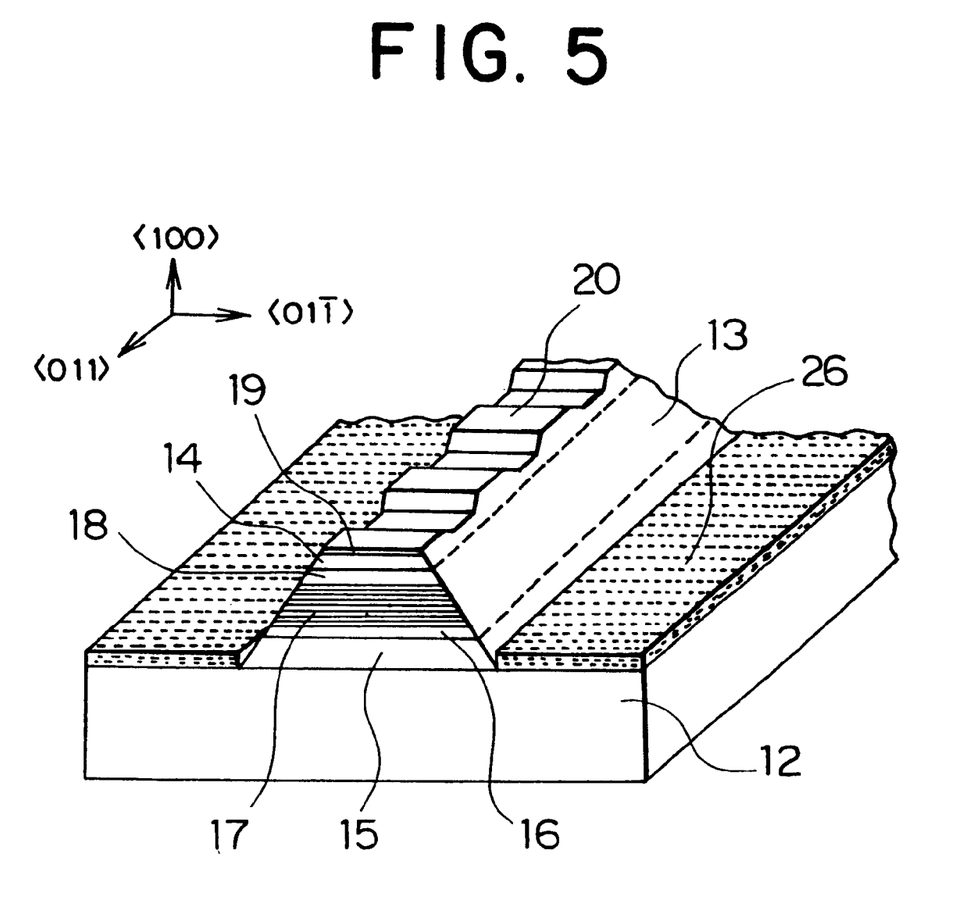
FIG. 5 is a perspective view illustrating a principal portion of the semiconductor laser device of FIGS. 4A and 4B.

More specifically, during the selective growth process, as shown in FIG. 5 illustrating the semi-finished product of the semiconductor laser of FIGS. 4A and 4B in a perspective view, an n-InP cladding layer 15 is first grown, followed by growing an InGaAsP optical confinement layer 16 having a wavelength of 1.3 μm to a thickness of 60 nm. An InGaAsP barrier layer having a wavelength of 1.3 μm is then grown to a thickness of 10 nm, followed by growing a multiple quantum well layer 17 of seven cycles of strained InGaAsP films having a wavelength of 1.7 μm to a thickness of 6 nm. The multiple quantum well layer 17 thus formed has a bandgap wavelength equal to 1.55 μm, and a group of the layers 15 to 17 define the active layer 13 shown in FIGS. 4A and 4B.

Another InGaAsP optical confinement layer 18 having a wavelength of 1.3 μm is grown to a thickness of 20 nm on the active layer 13, and then an InGaAsP optical guide layer 14 having a wavelength of 1.2 μm is grown to a thickness of 90 nm, followed by growth of a p-InP cladding layer 19 to a thickness of 5 nm, thereby achieving an elongate mesa structure having a shape of trapezoid in cross-section. The cross-section. thus formed by the selective growth technique is different from the conventional structure shown in FIGS. 2A and 2B.

The top surface of the resultant mesa structure is then coated with an electron beam resist using a spinner (not shown). The resist layer thus formed is small in thickness and flat on the flat top surface of the mesa structure, whereas large in thickness and slanted on the slanted side surfaces of the mesa structure. Accordingly, after the resist layer is exposed to an electron beam irradiated in the direction normal to the main surface of the substrate, substantially only the top surface of the mesa structure is etched, thereby forming a diffraction grating 20 on the top surface of the mesa structure. The diffraction grating 20 thus formed has a depth of 25 nm and a period of 240 nm. Since the cladding layer 19 having a thickness of 5 nm is formed on top of the optical guide layer 14, after the diffraction grating 20 is formed to the depth of 25 nm, the depth of the diffraction grating 20 within the optical guide layer 14 is equal to 20 nm.

Subsequently, the $SiO_2$ mask 26 is etched by a photolithographic etching step to increase the lateral width of the opening up to 7 μm, and a p-InP embedding layer 21 is grown on the mesa structure and in the increased opening to a thickness of 1.5 μm, as shown in FIG. 4A. A p$^+$-InP contact layer 22 is then grown to a thickness of 0.3 μm on the top surface of the mesa of the embedding layer 21.

An insulating film 23 made of $SiO_2$ is then formed to a thickness of 0.3 μm over the entire surface, as shown in FIG. 4B, followed by forming an opening in the top thereof. A Ti/Au film is formed by evaporation through the top opening, then patterned to define a Ti/Au p-electrode 24. The bottom surface of the substrate 12 is then polished to achieve a total thickness of about 100 μm, and Ti/Au is evaporated on the polished bottom surface of the substrate 12 to define a Ti/Au n-electrode 25. Finally, a reflecting film having a low reflectance is formed over the entire front facet of the mesa structure, whereas a reflecting film having a high reflectance is formed on the entire rear facet.

In operation, when a voltage is applied across the electrodes 24 and 25 of the semiconductor laser 11 of the present embodiment, the active layer 13 emits laser light, and the laser light is subjected to a distributed feedback through the diffraction grating 20 formed on top of the optical guide layer 14. Since the active layer 13 for emitting laser light and the optical guide layer 14 for effecting a distributed feedback are consecutively formed by selective growth processes, the effective refractive index of the combination of the layers 13 and 14 is not substantially affected by any fabrication error, and thus maintained substantially constant, thereby achieving an excellent evenness in the lasing wavelength of the semiconductor laser.

In the above embodiment, the trapezoid mesa structure formed by the selective growth process provides a variable mesa width for the layers 13 and 14 depending on the width of the opening in the mask 26, which defines the width of the region of selective growth. In this embodiment, the mesa structure has a (111)B facets as its side surfaces resulting from the selective growth process, it will be seen that the growth rate of the film thickness increases as the growth proceeds, thereby reducing the layer width. Accordingly, as mentioned above with reference to FIG. 1, if there occurs a variation in the width Wg1/Wg2 of the region for the selective growth due to fabrication errors, the film width Wa1/Wa2 also varies in proportion to the width Wg1/Wg2, whereas the film thickness d1/d2 varies in inverse proportion to the width Wg1/Wg2.

If the refractive index of the optical guide layer 14 is greater than the refractive index of the surrounding embedding layer 21, the effective refractive index of the optical guide layer 14 increases with the increases of the layer width Wa and the layer thickness "d" thereof. Since the layer width Wa and the layer thickness "d" vary in the opposed directions, it is possible to maintain the effective refractive index substantially at a constant by a mutual compensation between the change in the effective refractive index caused by the variation in the layer width Wa and the change in the effective refractive index caused by the variation in the layer thickness "d". For this reason, the semiconductor laser 11 can be manufactured so as to lase at a desired wavelength, thereby providing a semiconductor laser device having a constant lasing wavelength by compensating any fabrication error.

As mentioned previously in the conventional semiconductor laser with reference to FIGS. 2A and 2B, the film width Wa is determined by the lateral width Wm of A the mask and the amount of etching. By contrast, in the semiconductor laser according to the present embodiment, the film width Wa of the layers 13 and 14 depends only on the width of the opening in the mask 26. Since this width is determined by the accuracy of the current photolithographic technique applied, the layers 13 and 14 can be easily fabricated to have a desired layer width in the semiconductor laser of the present embodiment.

In particular, the dependency of the layer thickness "d" of the optical guide layer 14 upon the layer width of the region of the selective growth increases toward the top of the mesa structure, and an enhanced compensation factor can be obtained in the semiconductor laser 11 of the present embodiment because the optical guide layer 14 is located in the top portion of the mesa structure and above the active layer 13.

Further, as mentioned previously with reference to FIG. 3, with the conventional semiconductor laser, the variation of the width Wa of the active layer within ±0.2 μm generates a variation in the lasing wavelength up to about ±1.4 nm. By contrast, with the semiconductor laser 11 of the present embodiment, it was confirmed that the change in the lasing wavelength was drastically reduced down to about ±0.2 nm, thereby suppressing the change in the lasing wavelength which is caused by a fabrication error for the width Wa of the active layer 13. This suppression achieves the change equal to or below a quarter of the change in the conventional value.

As discussed, the method of manufacturing the semiconductor laser device 11 according to the present embodiment allows a fabrication error to be compensated for to achieve a desired lasing wavelength of excellent evenness, thereby facilitating the manufacture of the semiconductor laser 11 of distributed feedback type having an excellent evenness of the lasing wavelength. Accordingly, the semiconductor laser 11 of the present embodiment is suitable to a light source for a variety of equipment and arrangements including a long distance optical communication system, a wavelength-multiplexed optical communication system, optical information processing system, an optical information recorder, optical measurement equipment, and a variety of similar systems.

In the semiconductor laser of the described embodiment, the embedding layer 21 disposed above the mesa structure to extend toward the sides thereof is made of p-InP, which has a refractive index less than that of InGaAsP constituting the optical guide layer 14. Accordingly, the effective refractive index can be maintained substantially constant by taking advantage of opposite changes occurring in the magnitudes of the width Wa and the thickness "d" of the optical guide layer 14.

In addition, as it is generally known that a semiconductor having a smaller refractive index exhibits a greater bandgap, the leakage current can be reduced while a potential barrier, which generally degrades the current injection efficiency, can be suppressed between the embedding layer 21 and the optical guide layer 14. If such a current problem can be solved by separate means, it is also possible to form the embedding layer 21 from a material which exhibits a greater refractive index than the optical blocking layer 14.

Figure 6A:
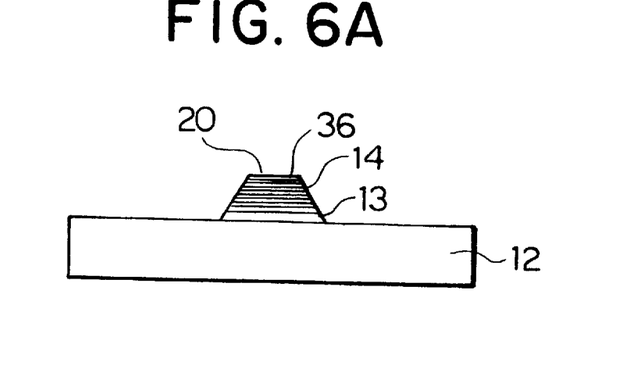
FIGS. 6A through 6C are cross-sectional views of a semiconductor laser device during consecutive steps thereof in a method according to a second embodiment of the present invention.
Figure 6B:
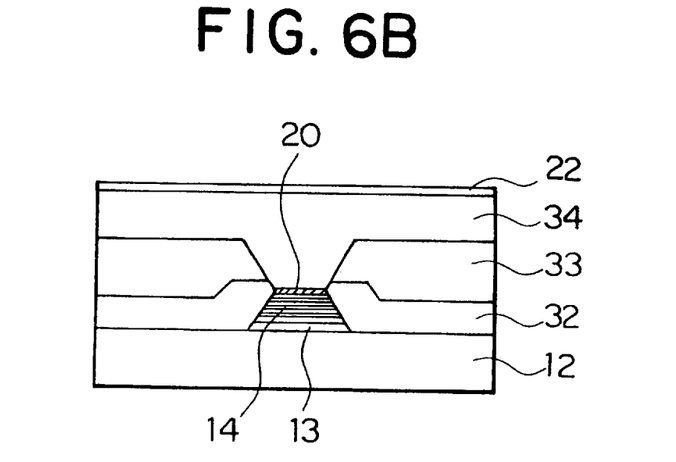
Figure 6C:
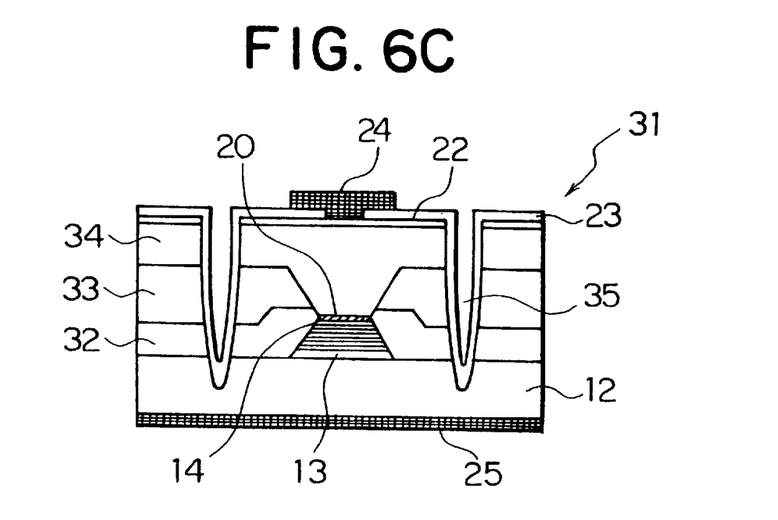

Referring to FIGS. 6A to 6C, there are shown consecutive steps in a method for manufacturing a semiconductor laser device according to a second embodiment of the present invention. Initially, a trapezoid mesa structure including an active layer 13 and an optical guide layer 14 is formed on the substrate 12 by using a selective growth process, and a diffraction grating 20 is formed on the top surface thereof. A $SiO_2$ film 36 is then formed on the top surface of the mesa structure, as shown in FIG. 6A.

The technique to form the $SiO_2$ film 36 on a selectively grown layer is described in detail by an article by Sakata et al. (Photon. Tech. Lett., vol. 8 number 2, February 1996). During the process, portions of the $SiO_2$ film 36 located on both the sides of the mesa structure is removed by a selective etching.

Subsequently, using the $SiO_2$ film 36 as a mask, a p-InP current blocking layer 32 and an n-InP current blocking layer 33 are consecutively grown, as shown in FIG. 6B. The $SiO_2$ film 36 is then removed, and a p-InP embedding layer 34, which also serves as a cladding layer, is grown, followed by forming a $p^+$-InGaAs contact layer 22.

Subsequently, for the purpose of electric isolation between adjacent elements, a plurality of grooves 35 having a depth between 4 μm and 5 μm are formed at a spacing of 20 μm between adjacent grooves, by using photolithographic and etching technique, as shown in FIG. 6C. The active layer 13 is disposed at the center between a pair of grooves 35. Another $SiO_2$ film 23 is formed to a thickness of 0.3 μm over the entire surface, followed by forming therein an opening having a lateral width of 5 μm for exposing the active layer 13 by using photolithographic and etching technique. Subsequent steps are similar to those used in the first embodiment, including the step of forming top and bottom electrodes 24 and 25 and reflective films on the front and the rear facets. It should be noted that in the present embodiment, a plurality of semiconductor lasers 31 are formed in an array on a single substrate 12, and are separated from one other by the grooves 35.

With the semiconductor laser 31 of the present embodiment, similarly to the first embodiment, an even lasing wavelength can be achieved by taking advantage of opposite changes in the film thickness and in the film width because the active layer 13 and the optical guide layer 14 are consecutively formed by using the selective growth process. In addition, dedicated current blocking layers 32 and 33 formed on the opposite sides of the mesa structure are effective in alleviating leakage current during the operation, thereby improving response characteristics such as a reduction in the threshold current or enhancement in operational efficiency.

In the semiconductor laser of the present embodiment, as in the first embodiment, the InP current blocking layers 32 and 33 disposed on the opposite sides of the mesa structure as well as the overlaying InP embedding layer 34 have a refractive index which is less than the refractive index of the InGaAsP optical guide layer 14. Accordingly, by taking advantage of opposite changes in the width and in the thickness of the optical guide layer 14, the effective refractive index can be maintained substantially at a constant and leakage current can be reduced.

In the semiconductor lasers of the first and the second embodiments, aluminum (Al) is not contained in the optical guide layer which is attributable to the use of the InP substrate. Further, in the semiconductor laser 31 of the second embodiment, Al is not used for the embedding layers 32 and 33 having a refractive index less than that of the optical guide layer 14.

By contrast, if GaAs is used for the substrate 12, and AlGaAs or AlGaInP is used for the active layer 13 and the optical guide layer 14, it is likely that an oxidation of Al occurs on the surface of the optical guide layer 14 during the manufacture of the diffraction grating 20. In addition, to form the current blocking layers 32 and 33 having a lower refractive index as compared with the optical guide layer 14 and exhibiting a greater bandgap, an Al enriched composition is generally used. In such an instance, the Al content on the surface of the current blocking layers 32 and 33 may be oxidized during the removal of the $SiO_2$ film, and impede the epitaxial growth at the interface during the subsequent steps for forming the embedding layer 34 and the contact layer 22. This may degrade the response of the semiconductor lasers 11 and 31 and causes a variation in the operating current from product to product. Because the refractive index of a semiconductor varies with an injected current, it may result in a variation in the lasing wavelength.

In the semiconductor laser of the present embodiment, the active layer 13 and the optical guide layer 14 made of an InGaAsP based semiconductor material are grown on the InP substrate 12, thereby preventing the problems mentioned above and producing a laser light having a high level of evenness of the lasing wavelength.

Figure 7:
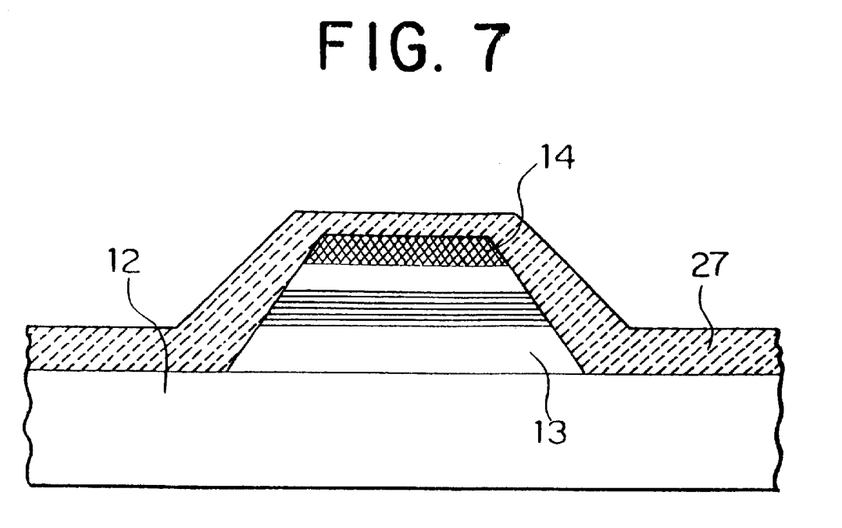
FIG. 7 is a front view, partly in a cross-section, of a mesa structure coated with a resist in the semiconductor laser device of FIGS. 6A through 6C.

In the semiconductor lasers of the first and the second embodiments, it has been described that in the process of forming the diffraction grating 20 on top of the optical guide layer 14 of the mesa structure, a resist 27 is coated by a spinner, and by taking advantage of the fact that the resist 27 is thinner on the top surface of the mesa structure, as shown in FIG. 7, the diffraction grating 20 can be selectively formed on the top surface of the mesa structure. However, with this technique, it is possible that the periodic grooves may extend to the lateral sides of the mesa structure depending on the material for the resist layer 27 or the exposure parameters. The lateral sides of the mesa structure is formed as (111)B facets on which there occurs little crystal growth, and accordingly, the grooves formed in the side surfaces of the mesa structure may extend to the active layer 13. In such an instance, part of the active layer 13 will become a re-growth interface having defects, thereby degrading the response characteristics of the laser.

Figure 8:
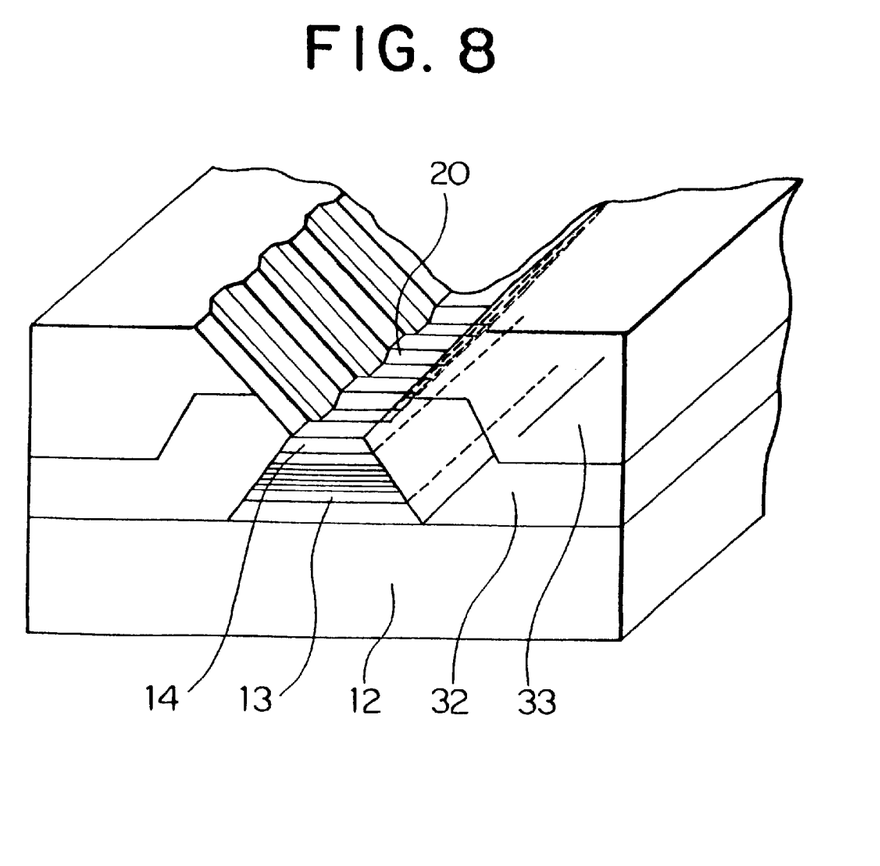
FIG. 8 is a perspective view of a principal portion of a semiconductor laser device according to a third embodiment of the present invention.

Another method of manufacturing a semiconductor laser according to a third embodiment of the invention can overcome the possible problem as mentioned above. FIG. 8 is a perspective view of a semi-finished product of a semiconductor laser manufactured by the third embodiment.

Initially, a mesa structure including active layer 13 and optical guide layer 14 is formed on a substrate 12 by using the selective growth process, as in the first and second embodiments, and a $SiO_2$ film 36 is formed on the top surface of the mesa structure without forming a diffraction grating 20.

Using the $SiO_2$ film 36 as a mask, p-InP and n-InP current blocking layers 32 and 33 are selectively grown, and the $SiO_2$ film 36 is then removed. A diffraction grating 20 is then formed on top of the optical guide layer 14 of the mesa structure by exposure to an electron beam or by an interference exposure technique. Subsequently, the resist is removed, and then processes similar to those in the first and second embodiments are performed.

In the method of manufacturing a semiconductor laser device according to the third embodiment, the current blocking layers 32 and 33 are formed on both the sides of the mesa structure before the diffraction grating 20 is formed, and accordingly, grooves cannot extend into the lateral surfaces of the mesa structure during the step for forming the diffraction grating 20. With the method of the present embodiment, the grooves are formed in part of the lateral surfaces of the InP current blocking layers 32 and 33, which does not affect the response characteristics of the laser however, because the following InP embedding layer 34 embeds them with the same material.

With the method of the third embodiment, an adverse influence by the process of forming the diffraction grating 20 upon the active layer 13 can be avoided, allowing a semiconductor laser device 31 having excellent response characteristics to be manufactured.

It should be understood that the present invention is not limited to the specific configurations disclosed above, but that a number of changes, modifications and substitutions therein can be made without departing from the spirit and the scope of the present invention.

For example, while it is described that an even diffraction grating 20 is formed on the entire optical guide layer 14 in the embodiments, it is possible to dispose a quarter wavelength phase shift within the laser at or in the vicinity of the center of the diffraction grating 20 to achieve a stable single mode lasing, or to dispose a partial diffraction grating 20 on the optical guide layer to achieve a low distortion response during the analog modulation.

In distinction to a semiconductor laser having a diffraction grating 20 on the entire region, the semiconductor laser device having a quarter wavelength phase shift within the diffraction grating 20 lases at a Bragg's wavelength independently from the phase on the facet, allowing the evenness of the wavelength to be improved. This is particularly effective in improving the evenness of the lasing wavelength by taking advantage of opposite changes in the thickness and in the width of the optical guide layer in accordance with the present invention.

The semiconductor laser of distributed feedback type in which a partial diffraction grating 20 is formed exhibits a reduced modulation distortion as compared with an arrangement in which a diffraction grating 20 is formed over the entire area, and also exhibits an excellent reflection resistance (see Okuda et al. , Electron. Lett. , 30, p 862, 1994). Accordingly, when the evenness of the lasing wavelength is improved by the opposite changes in the thickness and in the width of the optical guide layer in accordance with the present invention, it is possible to satisfy the demand for various specifications of semiconductor lasers such as the lasing wavelength or modulation distortion.

In the above description, a multiple quantum well structure is exemplarily described for the active layer 13. However, a single quantum well layer or bulk layer may be used instead. This is also applicable to a semiconductor laser made of materials other than those described in the embodiments.

What is claimed is:

1. A semiconductor laser device comprising a semiconductor substrate, a mesa structure having a shape substantially of a trapezoid in cross-section and selectively grown on said semiconductor substrate, said mesa structure having an active layer for emitting laser light and an optical guide layer overlying said active layer and having a diffraction grating thereon, said diffraction grating implementing distributed feedback for said laser light.

2. A semiconductor laser device as defined in claim 1, further comprising a first embedding layer grown on both sides of said mesa structure and a second embedding layer grown on top of said optical guide layer of said mesa structure, wherein each of said first and second embedding layers has a refractive index lower than a refractive index of said optical guide layer.

3. A semiconductor laser device as defined in claim 2, wherein said semiconductor substrate is made of an InP based material, and each of said active layer and said optical guide layer is made of an InGaAsP based material.

4. A semiconductor laser device as defined in claim 1, said diffraction grating has a quarter wavelength phase shift located in the vicinity of a center of said optical guide layer as viewed in a lasing direction of said semiconductor laser.

5. A semiconductor laser device as defined in claim 1, wherein said diffraction grating is formed as a partial diffraction grating.

* * * * *